United States Patent
Fujioka et al.

(10) Patent No.: US 8,563,495 B2
(45) Date of Patent: Oct. 22, 2013

(54) RESIST REMOVER COMPOSITION AND METHOD FOR REMOVING RESIST USING SAME

(75) Inventors: Toyozo Fujioka, Chiba (JP); Hayato Yamasaki, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 77 days.

(21) Appl. No.: 13/147,267

(22) PCT Filed: Jan. 29, 2010

(86) PCT No.: PCT/JP2010/051274
§ 371 (c)(1),
(2), (4) Date: Aug. 1, 2011

(87) PCT Pub. No.: WO2010/090146
PCT Pub. Date: Aug. 12, 2010

(65) Prior Publication Data
US 2011/0287995 A1  Nov. 24, 2011

(30) Foreign Application Priority Data

Feb. 3, 2009 (JP) ................................. 2009-022428
Jun. 12, 2009 (JP) ................................. 2009-141030

(51) Int. Cl.
*C11D 7/50* (2006.01)
*C11D 11/00* (2006.01)

(52) U.S. Cl.
CPC .................................. *C11D 11/0047* (2013.01)
USPC ........................................ 510/175; 510/176

(58) Field of Classification Search
USPC ................................... 510/175, 176
See application file for complete search history.

(56) References Cited

U.S. PATENT DOCUMENTS

| | | | | |
|---|---|---|---|---|
| 6,140,027 | A * | 10/2000 | Baik et al. ...................... | 430/331 |
| 6,774,097 | B2 * | 8/2004 | Yoon et al. ...................... | 510/176 |
| 6,861,210 | B2 * | 3/2005 | Baik et al. ...................... | 430/331 |
| 6,908,892 | B2 * | 6/2005 | Yoon et al. ...................... | 510/176 |
| 7,015,183 | B2 * | 3/2006 | Baik et al. ...................... | 510/176 |
| 7,704,939 | B2 * | 4/2010 | Suzuki et al. ................... | 510/436 |
| 8,324,143 | B2 * | 12/2012 | Suzuki et al. ................... | 510/175 |
| 2003/0100459 | A1 * | 5/2003 | Yoon et al. ...................... | 510/175 |
| 2003/0158058 | A1 * | 8/2003 | Yoon et al. ...................... | 510/175 |
| 2004/0009883 | A1 * | 1/2004 | Ikemoto et al. ................. | 510/175 |
| 2004/0106531 | A1 | 6/2004 | Kanno et al. | |
| 2004/0152022 | A1 * | 8/2004 | Baik et al. ...................... | 430/331 |
| 2004/0185370 | A1 * | 9/2004 | Baik et al. ...................... | 430/270.1 |
| 2005/0101500 | A1 * | 5/2005 | Baik et al. ...................... | 510/175 |
| 2006/0287207 | A1 | 12/2006 | Park et al. | |
| 2007/0167343 | A1 * | 7/2007 | Suzuki et al. ................... | 510/329 |
| 2011/0245127 | A1 * | 10/2011 | Suzuki et al. ................... | 510/163 |
| 2012/0181248 | A1 * | 7/2012 | Park et al. ...................... | 216/13 |

FOREIGN PATENT DOCUMENTS

| | | |
|---|---|---|
| CN | 1495534 A | 5/2004 |
| EP | 0 051 163 A2 | 5/1982 |
| EP | 0 051 163 A3 | 5/1982 |
| EP | 2 192 450 A1 | 6/2010 |
| GB | 1 262 002 | 2/1972 |
| JP | 2003 532143 | 10/2003 |
| JP | 2005 43873 | 2/2005 |
| JP | 2005 43874 | 2/2005 |
| JP | 2005 47885 | 2/2005 |
| JP | 2006 350325 | 12/2006 |
| JP | 2007-146002 A | 6/2007 |
| JP | 2007-256483 A | 10/2007 |
| JP | 2007-256822 A | 10/2007 |
| JP | 2008 256991 | 10/2008 |
| WO | 2007 148574 | 12/2007 |
| WO | WO 2007148574 A1 * | 12/2007 |

OTHER PUBLICATIONS

Office Action issued Jul. 30, 2012, in Chinese Patent Application No. 201080006366.X.
Extended European Search Report issued Sep. 5, 2012 in Patent Application No. 10738480.2.
International Search Report Issued Feb. 23, 2010 in PCT/JP10/051274 filed Jan. 29, 2010.

* cited by examiner

*Primary Examiner* — Gregory Webb
(74) *Attorney, Agent, or Firm* — Oblon, Spivak, McClelland, Maier & Neustadt, L.L.P.

(57) ABSTRACT

There are provided a resist remover composition containing an amide solvent (A) represented by the following formula (1) and an organic amine compound (B), and a method for removing a resist using the resist remover composition, i.e., a resist remover composition that provides a sufficient removing capability even in a state where a resist is dissolved therein and is capable of being used for a prolonged period of time, and a method for removing a resist using the same.

$$R^1\text{-}O\text{-}(CH_2)_n\text{-}C(=O)\text{-}N(R^3)\text{-}R^2 \quad (1)$$

wherein $R^1$ represents a linear, branched or cyclic alkyl group having from 1 to 6 carbon atoms; $R^2$ and $R^3$ each independently represent a linear or branched alkyl group having from 1 to 3 carbon atoms; and n represents an integer of from 0 to 2.

18 Claims, No Drawings

RESIST REMOVER COMPOSITION AND METHOD FOR REMOVING RESIST USING SAME

TECHNICAL FIELD

The present invention relates to a resist remover composition and a method for removing a resist using the same, and more particularly, a resist remover composition that has a long service life as a remover and is capable of being used for a prolonged period of time, and a method for removing a resist using the same.

BACKGROUND ART

Liquid crystals and semiconductors are generally produced by using the photolithography technique. The photolithography technique includes a process step of removing an unnecessary resist (photosensitive agent) by dissolving the resist with a resist remover (cleaning agent).

Various kinds of the resist remover used in the process step have been invented. However, all the inventions have been made in view of the initial peeling property and the anticorrosion property to a wiring material, and are not developed in view of the length of service life.

A resist remover is researched and developed for enhancing the quality and productivity of liquid crystals and semiconductors, and for producing a liquid crystal panel in particular, a resist remover of a mixed system of a polar solvent, such as dimethylsulfoxide or diethylene glycol monobutyl ether, and monoethanolamine has been widely used.

After using the resist remover to a certain extent, the resist is dissolved in the resist remover, and the capability of removing the resist is deteriorated due to the increased concentration thereof. Accordingly, the current situation is that a part or the whole amount thereof is periodically withdrawn from the apparatus for exchanging.

Upon exchanging the resist remover, however, it is necessary to stop the removing apparatus once, which disadvantageously lower the productivity of liquid crystal panels. The used resist remover thus withdrawn is recovered and regenerated through distillation, and the distillation residue is discarded. The regeneration through distillation requires energy, and upon discarding the residue, a part of the remover liquid contained in the residue is disadvantageously lost.

Accordingly, it is demanded to develop a resist remover that maintains a sufficient removing capability even in a state where a resist is dissolved therein at a high concentration and has a long service life.

In a removing apparatus used in the production of liquid crystal panels, specifically, the panel is cleaned with a remover, and then rinsed with water in a state where the resist remover is attached to the surface of the panel. At this time, the resist remover attached to the surface of the panel is discarded in the form of rinsing waste water as a loss (entrainment loss). In addition to the entrainment loss, there is a loss that is eliminated as vapor or mist from the removing apparatus (vapor or mist loss). The remover is continuously used while replenishing the loss amount, and thereby the concentration of the resist in the resist remover in the removing apparatus reaches a certain equilibrium concentration. The equilibrium concentration varies depending on the tank capacity of the removing apparatus, the size of the liquid crystal panels, and the like, and is generally from 0.9 to 2% by mass.

Accordingly, such a resist remover is demanded that provides a sufficient removing capability even in a state where the resist is dissolved therein at a concentration of approximately from 0.9 to 2% by mass.

As a technique for extending the service life of the remover liquid, Patent Documents 1 and 2 disclose an example of addressing by machine, in which an on-line analyzer is provided for maintaining the compositional concentration of the resist remover. In the case where the technique is practiced, however, the cost of the apparatus is increased, and the service life essentially depends on the capability as a remover of the resist remover liquid.

Patent Document 3 discloses the technique, in which a device for regenerating the remover liquid online is attached to a resist removing apparatus. In the case where the technique is practiced, however, the apparatus can be operated for a prolonged period of time, but there are problems that the regeneration of the remover requires energy, a large-scale apparatus is required, and the regeneration cost is increased.

PRIOR ART REFERENCES

Patent Document

[Patent Document 1] JP-A-2004-186389
[Patent Document 2] JP-A-4-65829
[Patent Document 3] JP-A-2004-186208

SUMMARY OF THE INVENTION

Problems to be Solved by the Invention

The present invention has been made for solving the aforementioned problems, and an object thereof is to provide a resist remover composition that provides a sufficient removing capability even in a state where a resist is dissolved therein and is capable of being used for a prolonged period of time, and a method for removing a resist using the same.

Means for Solving the Problems

As a result of earnest investigations by the inventors for achieving the object, it has been found that the use of a resist remover composition containing an amide solvent (A) represented by the following formula (1) and an organic amine compound (B) in combination maintains the resist removing capability even when the resist concentration reaches approximately 2% by mass, and thus the present invention has been completed.

The present invention provides a resist remover composition containing an amide solvent (A) represented by the following formula (1) and an organic amine compound (B), and a method for removing a resist using the resist remover composition.

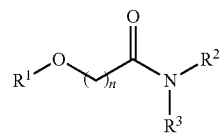

(1)

wherein $R^1$ represents a linear, branched or cyclic alkyl group having from 1 to 6 carbon atoms; $R^2$ and $R^3$ each independently represent a linear or branched alkyl group having from 1 to 3 carbon atoms; and n represents an integer of from 0 to 2.

Advantages of the Invention

The resist remover composition of the present invention has a long service life as a remover and is capable of being used for a prolonged period of time. Accordingly, by using the resist remover composition of the present invention, the removing capability can be maintained even though the removed resist is mixed therein and water is mixed therein from the water rinsing step as the subsequent step, and the resist remover composition can be continuously used without exchange, only by replenishing the loss amount of the resist remover composition including the loss entrained with the panels and the loss eliminated as vapor or mist. Consequently, the resist removing step can be simplified, and the resist removing step can be performed at low cost.

EMBODIMENTS FOR CARRYING OUT THE INVENTION

The resist remover composition of the present invention contains an amide solvent (A) represented by the formula (1) and an organic amine compound (B).

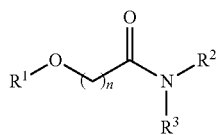
(1)

wherein $R^1$ represents a linear, branched or cyclic alkyl group having from 1 to 6 carbon atoms; $R^2$ and $R^3$ each independently represent a linear or branched alkyl group having from 1 to 3 carbon atoms; and n represents an integer of from 0 to 2.

Specific examples of the linear alkyl group include a methyl group, an ethyl group, a n-propyl group, a n-butyl group, a n-heptyl group and a n-hexyl group.

Specific examples of the branched alkyl group include an isopropyl group, a sec-butyl group, an isobutyl group, a t-butyl group, a 2-methylbutyl group, a 3-methylbutyl group, an isopentyl group, a 2-ethylpropyl group and a neopentyl group.

Specific examples of the cyclic alkyl group include a cyclopentyl group and a cyclohexyl group.

Specific examples of the amide solvent (A) include
3-methoxy-N,N-dimethylpropionamide,
3-ethoxy-N,N-dimethylpropionamide,
3-n-propoxy-N,N-dimethylpropionamide,
3-isopropoxy-N,N-dimethylpropionamide,
3-n-butoxy-N,N-dimethylpropionamide,
3-sec-butoxy-N,N-dimethylpropionamide,
3-t-butoxy-N,N-dimethylpropionamide,
3-n-pentyloxy-N,N-dimethylpropionamide,
3-cyclopentyloxy-N,N-dimethylpropionamide,
3-n-hexyloxy-N,N-dimethylpropionamide,
3-cyclohexyloxy-N,N-dimethylpropionamide,
3-methoxy-N,N-diethylpropionamide,
3-ethoxy-N,N-diethylpropionamide,
3-n-propoxy-N,N-diethylpropionamide,
3-isopropoxy-N,N-diethylpropionamide,
3-n-butoxy-N,N-diethylpropionamide,
3-sec-butoxy-N,N-diethylpropionamide,
3-t-butoxy-N,N-diethylpropionamide,
3-n-pentyloxy-N,N-diethylpropionamide,
3-cyclopentyloxy-N,N-diethylpropionamide,
3-n-hexyloxy-N,N-diethylpropionamide,
3-cyclohexyloxy-N,N-diethylpropionamide,
3-methoxy-N,N-di-n-propylpropionamide,
3-ethoxy-N,N-di-n-propylpropionamide,
3-n-propoxy-N,N-di-n-propylpropionamide,
3-isopropoxy-N,N-di-n-propylpropionamide,
3-n-butoxy-N,N-di-n-propylpropionamide,
3-sec-butoxy-N,N-di-n-propylpropionamide,
3-t-butoxy-N,N-di-n-propylpropionamide,
3-n-pentyloxy-N,N-di-n-propylpropionamide,
3-cyclopentyloxy-N,N-di-n-propylpropionamide,
3-n-hexyloxy-N,N-di-n-propylpropionamide,
3-cyclohexyloxy-N,N-di-n-propylpropionamide,
3-methoxy-N,N-diisopropylpropionamide,
3-ethoxy-N,N-diisopropylpropionamide,
3-n-propoxy-N,N-diisopropylpropionamide,
3-isopropoxy-N,N-diisopropylpropionamide,
3-n-butoxy-N,N-diisopropylpropionamide,
3-sec-butoxy-N,N-diisopropylpropionamide,
3-t-butoxy-N,N-diisopropylpropionamide,
3-n-pentyloxy-N,N-diisopropylpropionamide,
3-cyclopentyloxy-N,N-diisopropylpropionamide,
3-n-hexyloxy-N,N-diisopropylpropionamide,
3-cyclohexyloxy-N,N-diisopropylpropionamide,
3-methoxy-N,N-methylethylpropionamide,
3-ethoxy-N,N-methylethylpropionamide,
3-n-propoxy-N,N-methylethylpropionamide,
3-isopropoxy-N,N-methylethylpropionamide,
3-n-butoxy-N,N-methylethylpropionamide,
3-sec-butoxy-N,N-methylethylpropionamide,
3-t-butoxy-N,N-methylethylpropionamide,
3-n-pentyloxy-N,N-methylethylpropionamide,
3-cyclopentyloxy-N,N-methylethylpropionamide,
3-n-hexyloxy-N,N-methylethylpropionamide,
3-cyclohexyloxy-N,N-methylethylpropionamide,
3-methoxy-N,N-methylpropylpropionamide,
3-ethoxy-N,N-methylpropylpropionamide,
3-n-propoxy-N,N-methylpropylpropionamide,
3-isopropoxy-N,N-methylpropylpropionamide,
3-n-butoxy-N,N-methylpropylpropionamide,
3-sec-butoxy-N,N-methylpropylpropionamide,
3-t-butoxy-N,N-methylpropylpropionamide,
3-n-pentyloxy-N,N-methylpropylpropionamide,
3-cyclopentyloxy-N,N-methylpropylpropionamide,
3-n-hexyloxy-N,N-methylpropylpropionamide,
3-cyclohexyloxy-N,N-methylpropylpropionamide,
3-methoxy-N,N-ethylpropylpropionamide,
3-ethoxy-N,N-ethylpropylpropionamide,
3-n-propoxy-N,N-ethylpropylpropionamide,
3-isopropoxy-N,N-ethylpropylpropionamide,
3-n-butoxy-N,N-ethylpropylpropionamide,
3-sec-butoxy-N,N-ethylpropylpropionamide,
3-t-butoxy-N,N-ethylpropylpropionamide,
3-n-pentyloxy-N,N-ethylpropylpropionamide,
3-cyclopentyloxy-N,N-ethylpropylpropionamide,
3-n-hexyloxy-N,N-ethylpropylpropionamide
3-cyclohexyloxy-N,N-ethylpropylpropionamide.

The amide solvent (A) may be used solely as a single kind thereof or used as a combination of two or more kinds thereof.

Specific examples of the organic amine compound (B) include a primary alkanolamine, such as monoethanolamine, monoisopropanolamine and monobutanolamine, a secondary alkanolamine, such as N-methylethanolamine, N-methylpropanolamine, N-methylbutanolamine, N-ethylethanolamine, diethanolamine and dipropanolamine, a secondary amine, such as diethylamine, dipropylamine and dibutylamine, a tertiary alkanolamine, such as N,N-dimethylethanolamine, N-methyldiethanolamine, N-ethyldiethanolamine, N-propyldiethanolamine and N-butyldiethanolamine, and a tertiary amine, such as triethylamine.

Among these, an ethanolamine compound, such as monoethanolamine, N-methylethanolamine and N,N-dimethylethanolamine, is preferably used from the standpoint of anticorrosion property, and N-methylethanolamine as a secondary alkanolamine and N,N-dimethylethanolamine as a tertiary alkanolamine are more preferred for exerting the anticorrosion property further largely.

The organic amine compound (B) may be used solely as a single kind thereof or used as a combination of two or more kinds thereof.

The resist remover composition of the present invention may contain water or a polyhydric alcohol. They may be added thereto simultaneously, or one of them may be added solely.

The resist remover composition of the present invention preferably contains a polyhydric alcohol. By using the composition, the removing capability can be maintained even when the amount of the organic amine compound (B) used is decreased.

The polyhydric alcohol may be any compound that has two or more hydroxyl groups in the molecule, and is preferably a compound represented by the formula (2).

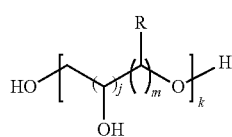

(2)

wherein k, j and m each independently represents an integer satisfying k=1 to 3, j=0 or 1, and m=1 to 3, and R represents a hydrogen atom or a methyl group.

Specific examples of the polyhydric alcohol include ethylene glycol, diethylene glycol, triethylene glycol, propylene glycol, dipropylene glycol, tripropylene glycol, glycerin, diglycerin, triglycerin and 1,4-butanediol, and ethylene glycol, propylene glycol and glycerin are preferred.

The polyhydric alcohol may be used solely as a single kind thereof or used as a combination of two or more kinds thereof.

The amount of the polyhydric alcohol contained in the resist remover composition of the present invention is not particularly limited and may be such an amount that the composition has a removing capability capable of being used as a remover, and the amount of the polyhydric alcohol added is preferably from 1 to 50 parts by mass per 100 parts by mass of the total amount of the remover composition. The amount is particularly preferably from 3 to 32 parts by mass where the removing capability is not influenced by the amount of the resist.

The resist remover composition of the present invention may contain water and an anticorrosive agent.

Examples of the anticorrosive agent include an aromatic polyhydroxy compound, such as pyrocatechol, t-butylcatechol, resorcinol, hydroquinone, pyrogallol and 1,2,4-benzenetriol, and a saccharide, such as xylitol, sorbitol, arabitol, mannitol, glucose and galactose, which are ordinarily used. The anticorrosive agent may be used solely as a single kind thereof or used as a combination of two or more kinds thereof.

The resist remover composition of the present invention preferably has a mass ratio of the amide solvent (A) and the organic amine compound (B) satisfying (A)/(B)=99/1 to 50/50, and more preferably (A)/(B)=97/3 to 70/30. When the amount of the component (A) is 50 or more, the sufficient resist removing capability is maintained, and when it is 70 or more, the sufficient resist removing capability is maintained for a further prolonged period of time.

The method for removing a resist of the present invention uses the resist remover composition of the present invention and may be used in various kinds of resist removing steps.

For example, the resist remover composition of the present invention may be used in a resist removing step in the array process of a liquid crystal panel, and the resist remover composition may be used without exchange, only by replenishing the loss amount of the resist remover composition including the loss entrained with the panels and the loss eliminated as vapor or mist outside the apparatus. This is because the resist remover composition of the present invention maintains the resist removing capability when the resist concentration reaches approximately 2% by mass, thereby eliminating the necessity of the exchange of the resist remover composition only by replenishing the resist remover composition.

The target, to which the photoresist remover composition of the present invention is applied, is not limited. For example, it may be used for removing a photoresist film on an inorganic substrate, such as a photoresist film coated on an inorganic substrate, a photoresist film remaining after wet-etching or dry-etching a photoresist film coated on an inorganic substrate, and a photoresist residue remaining after dry-etching and then ashing, and upon removing them, heating, ultrasonic wave or the like may be employed in combination depending on necessity.

The method of treating with the anticorrosive photoresist remover composition of the present invention is not particularly limited, and examples thereof include spraying, showering and immersing.

EXAMPLE

The present invention will be described in more detail with reference to examples below, but the present invention is not limited to the examples unless exceeding the substance thereof.

Examples 1 to 37 and Comparative Examples 1 to 6

Resist remover compositions were prepared according to the ratios shown in Tables 1 to 8, and evaluated for removing capability. The results are shown in the tables.
(1) Preparation of Remover Liquid (Resist Remover Composition)
(1-1) Preparation of Resist Solid Component A solvent component was removed from a positive resist composition (HPR204, produced by FUJIFILM Electronic Materials Co., Ltd., 8 cps) with an evaporator, and the solid residue was treated with a vacuum dryer at 130° C. for 4 hours under full vacuum, thereby removing the solvent component completely.
(1-2) Preparation of Remover Liquid The amide solvent, the organic amine compound, water and the anticorrosive agent were mixed at the ratios shown in Tables 1 to 8 by an ordinary method, thereby preparing remover liquids (resist remover compositions). In Examples 5 to 37 and Comparative Examples 2, 4 and 6, the resist solid component was mixed therein under assumption that the resist solid component remaining in the removing step. The ratios of the amide solvent and the organic amine compound are ratios, from which the resist solid component is excluded.

(2) Resist Removing Capability Test (Evaluation of Removing Capability)
(2-1) Preparation of Test Piece A positive resist composition (HPR204, produced by FUJIFILM Electronic Materials Co., Ltd., 8 cps) was coated on a glass plate, which had been sufficiently cleaned, with a spin coater (750 rpm, 20 s), and baked in an oven under the following condition.

Baking Condition:
80° C., 15 min+130° C., 15 min+160° C., 15 min

The glass plated cut into a size of approximately 5 mm×5 mm was used as a test piece, which was applied to the following resist removing capability test.

(2-2) Resist Removing Capability Test Method

Approximately 10 mL of the resist remover composition was placed in a beaker and maintained at a constant temperature of 70° C. with an oil bath.

The test piece was immersed in the remover liquid, withdrawn therefrom after lapsing 2 minutes, immediately rinsed sufficiently with pure water, and then sufficiently dried by air drying.

In the evaluation of the removing capability, the surface was observed with a scanning electron microscope, and the case where the resist was removed completely was shown as A, whereas the case where the resist remained if any was shown as B.

TABLE 1

| | Item | Example 1 | Example 2 | Example 3 | Example 4 | Example 5 | Example 6 |
|---|---|---|---|---|---|---|---|
| Amide solvent (A) | Kind *1 | amide-1 | amide-1 | amide-1 | amide-1 | amide-1 | amide-1 |
| | Ratio (part by mass) | 95 | 90 | 87.5 | 85 | 95 | 90 |
| Organic amine compound (B) | Kind *2 | amine-1 | amine-1 | amine-1 | amine-1 | amine-1 | amine-1 |
| | Ratio (part by mass) | 5 | 10 | 12.5 | 15 | 5 | 10 |
| Resist solid component | Concentration (wt %) *3 | 0 | 0 | 0 | 0 | 1 | 1 |
| | Evaluation result of removing capability | A | A | A | A | A | A |

| | Item | Example 7 | Example 8 | Example 9 | Example 10 | Example 11 | Example 12 |
|---|---|---|---|---|---|---|---|
| Amide solvent (A) | Kind *1 | amide-1 | amide-1 | amide-1 | amide-1 | amide-1 | amide-1 |
| | Ratio (part by mass) | 87.5 | 85 | 95 | 90 | 87.5 | 85 |
| Organic amine compound (B) | Kind *2 | amine-1 | amine-1 | amine-1 | amine-1 | amine-1 | amine-1 |
| | Ratio (part by mass) | 12.5 | 15 | 5 | 10 | 12.5 | 15 |
| Resist solid component | Concentration (wt %) *3 | 1 | 1 | 2 | 2 | 2 | 2 |
| | Evaluation result of removing capability | A | A | A | A | A | A |

*1 amide-1: 3-methoxy-N,N-dimethylpropionamide
*2 amine-1: N-methylethanolamine
*3 Concentration of the resist solid component based on the total amount of the amide solvent (A), the organic amine compound (B) and the resist solid component

TABLE 2

| | Item | Example 13 | Example 14 | Example 15 | Example 16 | Example 17 |
|---|---|---|---|---|---|---|
| Amide solvent (A) | Kind *1 | amide-2 | amide-3 | amide-4 | amide-1 | amide-1 |
| | Ratio (part by mass) | 87.5 | 87.5 | 87.5 | 87.5 | 87.5 |
| Organic amine compound (B) | Kind *2 | amine-1 | amine-1 | amine-1 | MEA | MEA |
| | Ratio (part by mass) | 12.5 | 12.5 | 12.5 | 12.5 | 12.5 |
| Resist solid component | Concentration (wt %) *3 | 2 | 2 | 2 | 1 | 2 |
| | Evaluation result of removing capability | A | A | A | A | B |

*1 amide-1: 3-methoxy-N,N-dimethylpropionamide amide-2: 3-butoxy-N,N-dimethylpropionamide amide-3: 3-methoxy-N,N-diethylpropionamide amide-4: 3-ethoxy-N,N-dimethylpropionamide
*2 amine-1: N-methylethanolamine MEA: monoethanolamine
*3 Concentration of the resist solid component based on the total amount of the amide solvent (A), the organic amine compound (B) and the resist solid component

TABLE 3

| Item | | Comparative Example 1 | Comparative Example 2 |
|---|---|---|---|
| Amide solvent (A) | Kind *1 | amide-1 | amide-1 |
| | Ratio (part by mass) | 100 | 100 |
| Organic amine compound (B) | Kind *2 | amine-1 | amine-1 |
| | Ratio (part by mass) | 0 | 0 |
| Resist solid component | Concentration (wt %) *3 | 0 | 1 |
| Evaluation result of removing capability | | A | B |

*1 amide-1: 3-methoxy-N,N-dimethylpropionamide
*2 amine-1: N-methylethanolamine MEA: monoethanolamine
*3 Concentration of the resist solid component based on the total amount of the amide solvent (A), the organic amine compound (B) and the resist solid component

TABLE 4

| Item | | Comparative Example 3 | Comparative Example 4 | Comparative Example 5 | Comparative Example 6 |
|---|---|---|---|---|---|
| Solvent | Kind *1 | DMSO | DMSO | BDG | BDG |
| | Ratio (part by mass) | 30 | 30 | 80 | 80 |
| Amine | Kind *2 | MEA | MEA | MEA | MEA |
| | Ratio (part by mass) | 70 | 70 | 20 | 20 |
| Resist solid component | Concentration (wt %) *3 | 0 | 0.5 | 0 | 0.5 |
| Evaluation result of removing capability | | A | B | A | B |

*1 DMSO: dimethylsulfoxide BDG: diethylene glycol monobutyl ether
*2 MEA: monoethanolamine
*3 Concentration of the resist solid component based on the total amount of solvent, the amine and the resist solid component

TABLE 5

| Item | | Example 18 | Example 19 | Example 20 | Example 21 | Example 22 | Example 23 | Example 24 |
|---|---|---|---|---|---|---|---|---|
| Amide solvent (A) | Kind *1 | amide-1 | amide-1 | amide-1 | amide-1 | amide-1 | amide-1 | amide-1 |
| | Ratio (part by mass) | 87.5 | 87.5 | 87.5 | 87.5 | 87.5 | 87.5 | 87.5 |
| Organic amine compound (B) | Kind *2 | amine-1 | amine-1 | amine-1 | amine-1 | amine-1 | amine-1 | amine-1 |
| | Ratio (part by mass) | 12.5 | 12.5 | 12.5 | 12.5 | 12.5 | 12.5 | 12.5 |
| Water | Ratio (part by mass) | 5 | 10 | 30 | 50 | 50 | 0 | 0 |
| Anti-corrosive agent | Kind *3 | — | — | — | — | — | HQ | xylitol |
| | Concentration (wt %) *4 | — | — | — | — | — | 0.9 | 1 |
| Resist solid component | Concentration (wt %) *5 | 2 | 2 | 2 | 1 | 2 | 2 | 2 |
| Evaluation result of removing capability | | A | A | A | A | B | A | A |

*1 amide-1: 3-methoxy-N,N-dimethylpropionamide
*2 amine-1: N-methylethanolamine
*3 HQ: p-hydroquinone
*4 Concentration of the anticorrosive agent based on the total amount of the amide solvent (A), the organic amine compound (B), the anticorrosive agent and the resist solid component
*5 Concentration of the resist solid component based on the total amount of the amide solvent (A), the organic amine compound (B), water, the anticorrosive agent and the resist solid component

TABLE 6

| Item | | Example 25 | Example 26 | Example 27 | Example 28 | Example 29 |
|---|---|---|---|---|---|---|
| Amide solvent (A) | Structure *1 | amide-1 | amide-1 | amide-1 | amide-1 | amide-1 |
| | Ratio (part by mass) | 90.5 | 86.4 | 73.1 | 64.6 | 63.3 |
| Organic amine compound (B) | Structure *2 | amine-1 | amine-1 | amine-1 | amine-1 | amine-1 |
| | Ratio (part by mass) | 4.8 | 4.5 | 3.8 | 3.4 | 3.3 |
| Ethylene glycol | Ratio (part by mass) | 4.7 | 9.1 | 23.1 | 32.0 | 33.4 |
| Resist solid component | Concentration (wt %) *3 | 2 | 2 | 2 | 2 | 1 |
| Evaluation result of removing capability | | A | A | A | A | A |

*1 amide-1: 3-methoxy-N,N-dimethylpropionamide
*2 amine-1: N-methylethanolamine
*3 Concentration of the resist solid component based on the total amount of the amide solvent (A), the organic amine compound (B), ethylene glycol and the resist solid component

TABLE 7

| Item | | Example 30 | Example 31 | Example 32 | Example 33 | Example 34 |
|---|---|---|---|---|---|---|
| Amide solvent (A) | Structure *1 | amide-1 | amide-1 | amide-1 | amide-1 | amide-1 |
| | Ratio (part by mass) | 90.5 | 86.4 | 73.1 | 64.6 | 63.3 |
| Organic amine compound (B) | Structure *2 | amine-1 | amine-1 | amine-1 | amine-1 | amine-1 |
| | Ratio (part by mass) | 4.8 | 4.5 | 3.8 | 3.4 | 3.3 |
| Propylene glycol | Ratio (part by mass) | 4.7 | 9.1 | 23.1 | 32.0 | 33.4 |
| Resist solid component | Concentration (wt %) *3 | 2 | 2 | 2 | 2 | 1 |
| Evaluation result of removing capability | | A | A | A | A | A |

*1 amide-1: 3-methoxy-N,N-dimethylpropionamide
*2 amine-1: N-methylethanolamine
*3 Concentration of the resist solid component based on the total amount of the amide solvent (A), the organic amine compound (B), propylene glycol and the resist solid component

TABLE 8

| Item | | Example 35 | Example 36 | Example 37 |
|---|---|---|---|---|
| Amide solvent (A) | Structure *1 | amide-1 | amide-1 | amide-1 |
| | Ratio (part by mass) | 90.5 | 86.4 | 73.1 |
| Organic amine compound (B) | Structure *2 | amine-1 | amine-1 | amine-1 |
| | Ratio (part by mass) | 4.8 | 4.5 | 3.8 |
| Glycerin | Ratio (part by mass) | 4.7 | 9.1 | 23.1 |
| Resist solid component | Concentration (wt %) *3 | 2 | 2 | 1 |
| Evaluation result of removing capability | | A | A | A |

*1 amide-1: 3-methoxy-N,N-dimethylpropionamide
*2 amine-1: N-methylethanolamine
*3 Concentration of the resist solid component based on the total amount of the amide solvent (A), the organic amine compound (B), glycerin and the resist solid component It is understood from the comparison of Examples 1 to 12 in Table 1 and Comparative Examples 1 to 6 in Tables 3 and 4 that the remover compositions having the combination of the amide solvent and the amine clearly provide the sufficient removing capability in the state where the resist solid component is dissolved therein.

It is understood from the comparison of Examples 7 and 11 in Table 1 and Examples 13 to 17 in Table 2 that the same advantage is obtained even when the kind of the amide solvent and the kind of the organic amine compound are changed. In the case where a secondary amine is used as the organic amine compound, in particular, a high removing capability is obtained under a high resist concentration.

As shown by Examples 18 to 24 in Table 5, the sufficient removing capability can be maintained even when water or the anticorrosive agent is added.

As seen from Examples 25 to 29 in Table 6, Examples 30 to 34 in Table 7 and Examples 35 to 37 in Table 8, the sufficient removing capability can be maintained even when ethylene glycol, propylene glycol or glycerin is added. Furthermore, the high removing capability is obtained with a small amount of the organic amine compound.

INDUSTRIAL APPLICABILITY

The resist remover composition of the present invention can be continuously used without exchange, only by replenishing the loss amount of the resist remover composition including the loss entrained with the panels and the loss eliminated as vapor or mist, and thereby the resist removing step can be performed with simple apparatus and process step at low cost. Consequently, resist remover composition of the present invention is considerably useful in a resist removing step in the production process of a liquid crystal display device, a semiconductor and the like.

The invention claimed is:

1. A resist remover composition, comprising:
(A) an amide solvent (A) represented by the following formula (1):

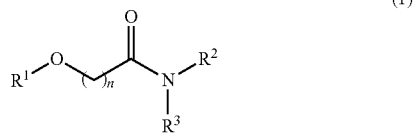

(1)

wherein
$R^1$ represents a linear, branched or cyclic alkyl group having from 1 to 6 carbon atoms,
$R^2$ and $R^3$ each independently represent a linear or branched alkyl group having from 1 to 3 carbon atoms, and
n is 1 or 2; and
(B) an organic amine compound (B).

2. The composition of claim 1, wherein the organic amine compound (B) comprises at least one compound selected from the group consisting of monoethanolamine, N-methylethanolamine, and N,N-dimethylethanolamine.

3. The composition of claim 1, further comprising:
(C) an aromatic polyhydroxy compound.

4. The composition of claim 1, further comprising:
a saccharide.

5. The composition of claim 1, wherein a mass ratio of the amide solvent (A) and the organic amine compound (B) satisfies (A)/(B)=99/1 to 50/50.

6. The composition of claim 1, wherein a mass ratio of the amide solvent (A) and the organic amine compound (B) satisfies (A)/(B)=97/3 to 70/30.

7. The composition of claim 1, further comprising:
a polyhydric alcohol comprising two or more hydroxyl groups in the molecule.

8. The composition of claim 7, wherein the polyhydric alcohol is a compound of formula (2):

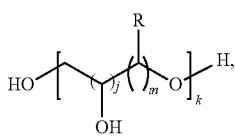

(2)

wherein k, j and m each independently represents an integer satisfying k=1 to 3, j=0 or 1, and m=1 to 3, and R represents a hydrogen atom or a methyl group.

9. A method for removing a resist, the method comprising contacting the resist with the composition of claim 1.

10. The method of claim 9, wherein the contacting is comprised in an array process of a liquid crystal panel, and the composition is employed without exchange, only by replenishing a loss amount of the composition entrained with at least one panel.

11. The composition of claim 1, wherein, in the amide solvent (A), $R^1$ represents a linear alkyl group having from 1 to 6 carbon atoms.

12. The composition of claim 1, wherein, in the amide solvent (A), $R^1$ represents a branched alkyl group having from 3 to 6 carbon atoms.

13. The composition of claim 1, wherein, in the amide solvent (A), $R^1$ represents a cyclic alkyl group having 6 carbon atoms.

14. The composition of claim 1, wherein, in the amide solvent (A), $R^2$ represents a linear alkyl group having from 1 to 3 carbon atoms.

15. The composition of claim 1, wherein, in the amide solvent (A), $R^2$ represents a branched alkyl group having 3 carbon atoms.

16. The composition of claim 1, wherein, in the amide solvent (A), $R^3$ represents a linear alkyl group having from 1 to 3 carbon atoms.

17. The composition of claim 1, wherein, in the amide solvent (A), $R^3$ represents a branched alkyl group having 3 carbon atoms.

18. The composition of claim 1, wherein the organic amine compound (B) comprises N-methylethanolamine.

* * * * *